United States Patent [19]

Lutz et al.

[11] 4,398,235

[45] Aug. 9, 1983

[54] VERTICAL INTEGRATED CIRCUIT PACKAGE INTEGRATION

[75] Inventors: Phillip A. Lutz; Phillip R. Motz; Eugene H. Sayers, all of Kokomo, Ind.

[73] Assignee: General Motors Corporation, Detroit, Mich.

[21] Appl. No.: 186,316

[22] Filed: Sep. 11, 1980

[51] Int. Cl.³ .............................................. H05K 7/02
[52] U.S. Cl. .................................. 361/393; 361/396; 339/17 CF; 357/75
[58] Field of Search ...................... 357/75; 174/52 FP; 339/17 CF, 17 N; 361/393, 394, 396, 405, 412, 413, 420, 426

[56] References Cited

U.S. PATENT DOCUMENTS

| 3,268,774 | 8/1966 | Ortner | 361/393 |
|---|---|---|---|
| 3,316,455 | 4/1967 | Hucke | 361/393 |
| 3,340,439 | 9/1967 | Henscher | 361/394 |
| 3,370,203 | 2/1968 | Kravitz | 361/396 |
| 3,403,300 | 9/1968 | Horowitz | 361/393 |
| 3,515,949 | 6/1970 | Michaels | 361/396 |
| 3,627,901 | 12/1971 | Happ | 174/52 PE |
| 3,697,818 | 10/1972 | Boursin | 339/17 CF |
| 4,080,026 | 3/1978 | Gianni | 339/17 CF |
| 4,252,390 | 2/1981 | Bowling | 339/17 CF |
| 4,254,446 | 3/1981 | Peoples | 361/393 |

OTHER PUBLICATIONS

S. Gerson, "Package Piggybacks Standard E-Prom to Emulate . . . Computers", Electronics, 1/31/80, pp. 89-92.

*Primary Examiner*—G. P. Tolin
*Attorney, Agent, or Firm*—Robert J. Wallace

[57] ABSTRACT

A compact assembly of similar type integrated circuit packages having a functionally similar terminal lead in non-corresponding lead positions. Two interconnection packages, of a type similar to the integrated circuit packages, are nested between the integrated circuit packages to re-route an electrical path from a terminal lead location on one integrated circuit package to a functionally similar but differently located lead position on the other integrated circuit package.

4 Claims, 9 Drawing Figures

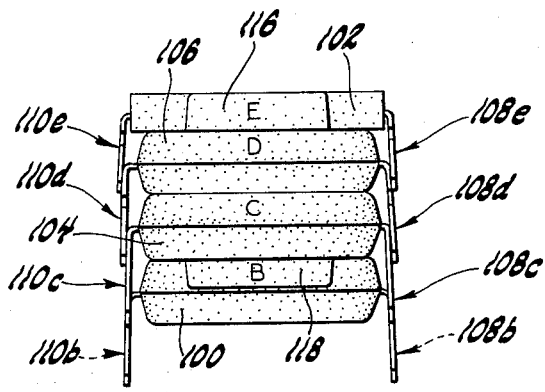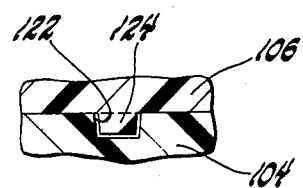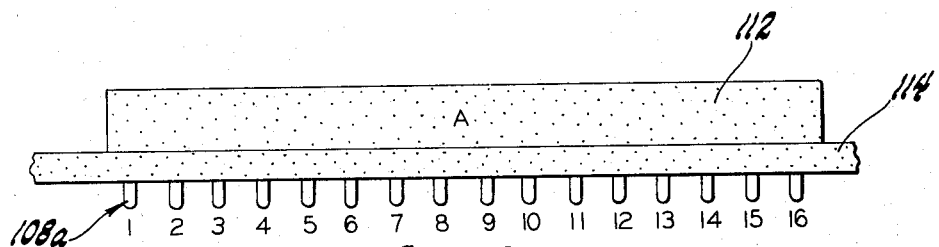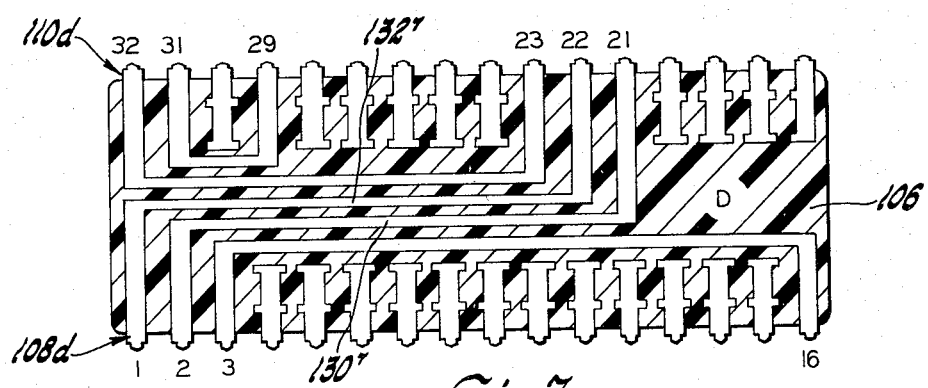

Fig. 9 CONNECTIONS

VERTICAL INTEGRATED CIRCUIT PACKAGE INTEGRATION

This invention relates to a compact vertical integration assembly of semiconductor device packages. It more particularly relates to a unitary assembly of two or more integrated circuit packages in which terminal functions on an upper package are located differently from terminal locations on a lower package.

In order to obtain a higher density of components on a printed circuit board, it has been known to "piggy back" one integrated circuit package on another. In such instance, leads on both integrated circuit packages are similar in function and location. This is required since the package leads are electrically in parallel when the packages are "piggy backed". Our invention differs from the prior "piggy backed" arrangement. Our invention does not require that the leads of the two packages be electrically similar in function or location. On the other hand, if there are such similar leads, they can be easily electrically paralleled, whether they are in similar locations or not.

It is, therefore, an object of this invention to provide an improved compact vertical integration assembly for integrated circuit packages.

The invention comprehends an assembly of at least two integrated circuit packages and two unique interconnection packages having internal shunts between selected terminal leads. Four such packages are vertically stacked, with the middle two packages in the stack being our unique interconnection packages. Each of the packages has at least one row of transverse terminal leads, with the middle two packages each having at least one more terminal lead than either of the top or bottom integrated circuit packages. All active terminal leads on the top integrated circuit package contact a corresponding terminal lead on the upper interconnection package. Selected, and less than all, leads on the latter package contact selected corresponding leads on the adjacent lower interconnection package. Some of the selected leads on the lower interconnection package contact all of the active leads on the bottom integrated circuit package. Each interconnection package has at least one terminal that does not contact a terminal on a package below it and internal electrical shunt means between that lead and another of its leads. The latter lead contacts a lead on a package below it or makes a terminal connection of its own. In this way, a terminal location on the top integrated circuit package is rerouted to a different location on the bottom package or to a location that does not exist on the bottom integrated circuit package.

Other objects, features and advantages of this invention will become more apparent from the following description of preferred examples thereof and from the drawings, in which:

FIG. 4 shows an elevational end view along the line 4—4 of FIG. 1;

FIG. 5 shows an enlarged fragmentary sectional view of the interface between the unique interconnection packages in the assembly, along the line 5—5 of FIG. 2;

FIG. 6 shows an elevational side view of a commercially available integrated circuit connector assembly mounted on a circuit board;

FIG. 7 shows a sectional view along the line 7—7 of FIG. 2;

FIG. 9 shows a table diagrammatically illustrating how leads are rerouted in the assembly of FIGS. 1-8.

Figure 1:
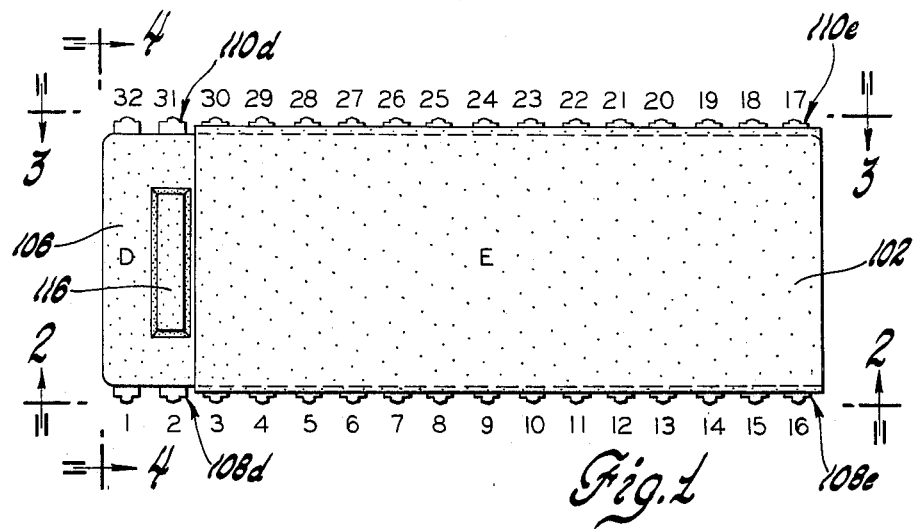
FIG. 1 shows an elevational top view of a compact vertical integration assembly contemplated by this invention.

Reference is now made to the drawing in which FIGS. 1 through 4 show one example of a compact vertical integration assembly contemplated by this invention. The assembly includes two dual in line integrated circuit packages B and E, each of which contains an integrated circuit chip (not shown). In such packages, selected chip portions are in low resistance electrical communication with selected package terminal leads (also not shown). One technique is to ultrasonically bond filamentary wires between a convergent pattern of inner free ends on the terminal leads and the selected chip portions. These integrated circuit packages B and E comprise the bottom and top packages in the stack respectively and are respectively indicated by reference numerals 100 and 102. Reference numerals in this patent application begin with 100 to avoid confusion with terminal lead location numbers hereinafter mentioned.

Nested between the top integrated circuit package E and the bottom integrated circuit package 100 are two unique interconnection packages C and D, which respectively have reference numerals 104 and 106. The lower interconnection package C and upper interconnection package D do not contain any integrated circuit chips, as can be seen by reference to FIGS. 7 and 8. Each of packages B, C, D and E are designated herein as dual-in-line (DIP) packages because each of them has two rows 108 and 110 of aligned and uniformly spaced terminal leads extending transversely from opposite package sides. Each package has a generally elongated body portion with generally flat top and bottom major surfaces that are mutually parallel. The rows 108 and 110 of terminal leads are parallel to these surfaces. However, the terminal leads themselves are not parallel to these surfaces, since they are bent downwardly at a sharp angle, almost orthogonal, to the top and bottom major surfaces on the packages.

The bottom integrated circuit package B has twelve terminals each and terminal lead rows are designated by reference numerals 108b and 110b. Lower interconnection package C has terminal lead rows 108c and 110c. Upper interconnection package D has terminal lead rows 108d and 110d. Both of the interconnection packages have sixteen terminals in each row. Top integrated circuit package E has terminal lead rows 108e and 110e, with fourteen terminals in each row.

The terminal lead rows 108b and 110b on the bottom integrated circuit package B are bent a suitable angle for insertion in a connector assembly A, reference numeral 112, which is affixed to a printed circuit board 114 in the usual manner. Connector A, reference numeral 112, is shown in FIG. 6. Connector assembly A is only shown in plan view because it forms no part of this invention. It is of any commercially available type and includes two rows 108a and 110a of sixteen sockets for receiving terminal leads, chiefly from terminal lead rows 108b and 110b. Only one sixteen socket row of terminal lead sockets 108a is visible in FIG. 6. The sockets in row 108a are numbered 1 through 16. The sockets in row 110a are numbered 17 through 32. The terminals on interconnection packages C and D are similarly numbered, for similar positioning on connector assembly A.

Figure 2:
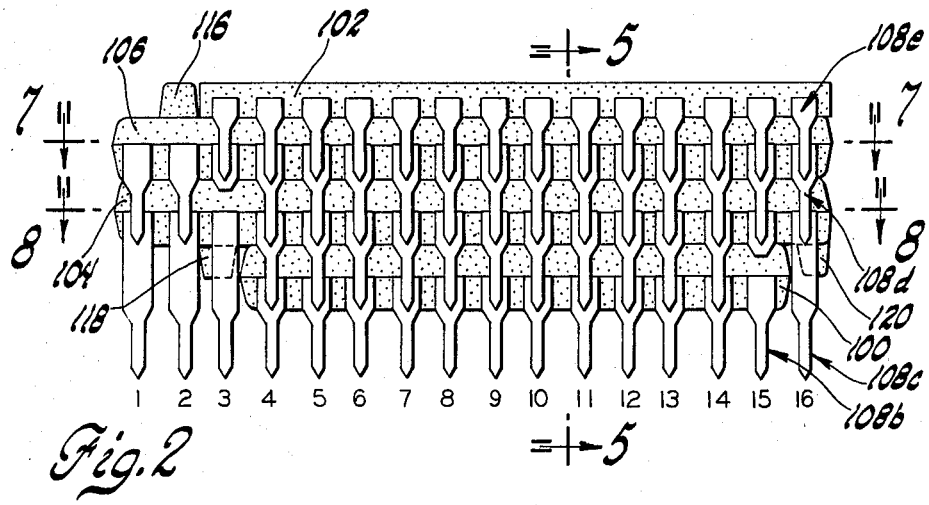
FIG. 2 shows an elevational side view along the line 2—2 of FIG. 1.
Figure 3:
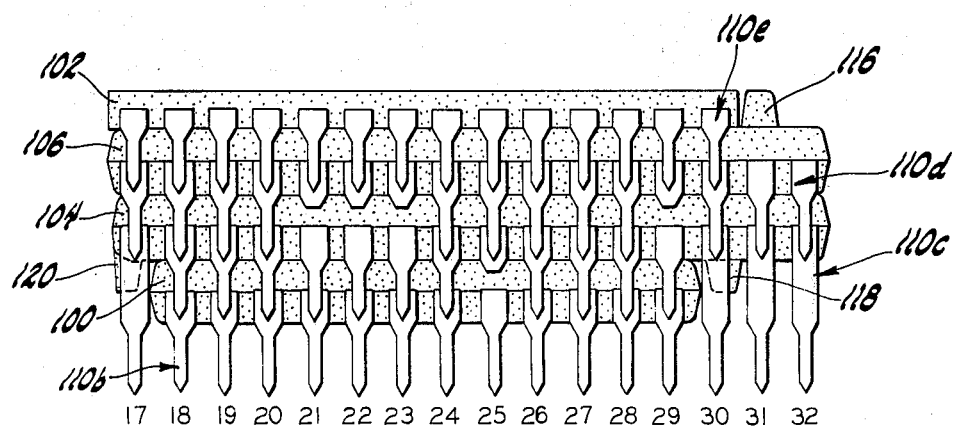
FIG. 3 shows an elevational side view along the line 3—3 of FIG. 1.

The terminals on the remaining packages C, D and E are all bent at approximately the same angle as the terminals on package B, so that the packages can be stacked and nested together with their major body surfaces contacting one another, and selected terminal leads of adjacent packages contacting one another. Selected terminal leads are soldered together to form a four package unitary assembly. Referring now to FIGS. 2 and 3, the terminal leads in each row of each package have the same regular spacing to permit registration of selected terminal leads when the packages are appropriately stacked on one another. Selected terminal leads in row 108e are soldered to the terminal leads in row 108d so that they overlap. Selected leads in row 108d, in turn, overlap and are soldered to registered terminal leads in row 108c. Selected terminal leads in row 108c, in further turn, overlap and are soldered to registered terminal leads in row 108b that they contact. Analogously, selected terminal leads in row 110e overlap and are soldered to registered terminal leads in row 110d. Selected terminal leads in row 110d, in turn, overlap and are soldered to registered terminal leads in row 110c. Selected terminal leads in row 110c, in further turn, overlap and are soldered to registered terminal leads in row 110b. The terminal lead at locations 3, 21-23 and 29 of upper interconnection package D do not overlap, and are not soldered to, terminal members on the lower interconnection package C. The terminal members at locations 1-3, 15, 17, 25 and 30-32 of lower interconnection package C do not overlap, and are not soldered to, terminal members on bottom integrated circuit package B.

In the example of this invention illustrated in the drawing, all of the terminal leads on the bottom integrated circuit package B and on the top integrated circuit package E are considered active. In other words, each lead is in low resistance electrical contact with a functioning part of integrated circuit chip (not shown) within the package. Hence, all of the terminal leads 108e and 110e overlap and are soldered to a terminal lead 108d and 110d on the upper interconnection package D. Because only a small rerouting is needed in this particular example, package D has only two more terminal leads than package E and only the package D terminal leads at locations 3, 21-23 and 29 are cut short.

Lower interconnection package C has the same number of terminal leads in each row as upper interconnection package D. Both of packages C and D have more leads in their rows than either of the top and bottom integrated circuit packages B and E. For example, package C has four more leads per side than package B. Terminal lead row 108c has three more leads than terminal lead row 108b at one end and one more at the opposite end. Terminal lead row 110c similarly differs from terminal lead row 110b. The additional leads in terminal lead row 108c are at locations, 1, 2, 3 and 16 on connector assembly A. The additional leads in terminal lead row 110c are at locations 17 and 30-32. Also, the additional leads at these locations are longer than the other leads in rows 108c and 110c. They are long enough to, when packages B and C are appropriately stacked, form extensions at each end of the terminal lead rows 108b and 110b. Selected ones of the remainder of the leads in rows 108c and 110c of package C overlap corresponding terminal leads in rows 108b and 110b of package B. Since the terminal leads in all packages are uniformly spaced, the longer leads in rows 108c and 110c appear to connector assembly A as if they were an integral part of terminal lead rows 108b and 110b. The longer leads on lower interconnection package C and all of the leads on active device bottom package B are appropriately spaced and aligned, the soldered assembly can be inserted as a 32 terminal unit into the 32 socket connector assembly A on circuit board 114.

Upper connection package D, reference numeral 106, has a boss 116 on its upper surface. Boss 116 provides a terminal registration abutment for one end of the top integrated circuit package E, reference numeral 102. Analogously, the lower interconnection package C, reference numeral 104, has two bosses, 118 and 120, as abutments for opposite ends on the bottom active integrated circuit device package 100. The two abutments 118 and 120 are provided on lower interconnection package C, because the end of bottom integrated circuit package B is not at the end of package C. Still further, as can be seen in connection with FIG. 5, the lower interconnection package C, reference numeral 104, has a recess 122 in its upper surface, within which nests a boss 124 on the lower surface of upper interconnection package D, reference numeral 106. By means of these bosses, the various packages are appropriately located with respect to one another. When stacked together with their major surfaces in contact with one another, selected terminal leads will be in contact with one another for easy soldering.

The interior of the upper interconnection package D, reference numeral 106, is as shown in FIG. 7. The terminal leads at locations 1 and 2 of terminal lead row 108d have a low resistance path to the terminals at locations 22 and 21, respectively, in row 110d on the opposite side of the package 106. The terminal at location 3 has a low resistance path to the terminal at location 16 in row 108d on the same side of the package 106. Similarly, terminals 23 and 32 are interconnected as well as terminals 29 and 31. The low resistance path is preferably an integral lead frame connecting portion but could be a printed or soldered connection.

Figure 8:
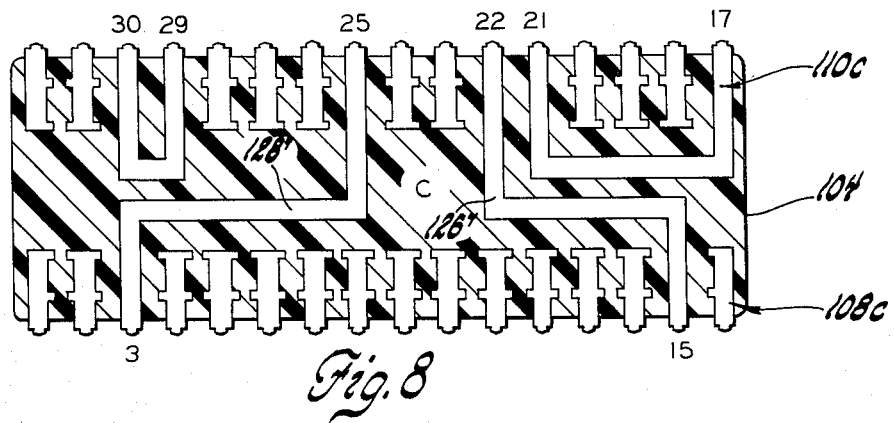
FIG. 8 shows a sectional view along the line 8—8 of FIG. 2.

FIG. 8 shows the interior of the lower interconnection package C, reference numeral 104. The terminals at positions 3 and 15 of terminal lead row 108c have low resistance paths, respectively, to the terminals at positions 25 and 22 of terminal lead row 110c on the opposite side of package 10. On that other side, the terminal lead at position 30 has a low resistance path to the adjacent terminal lead at position 29. The terminal lead at position 21 has a low resistance path to the terminal lead at position 17. The low resistance path is formed in the same way as described for FIG. 7.

The interconnection of the various leads in the finished unitary assembly is schematically illustrated in the table shown in FIG. 9. In the table, the terminal positions on each package are numerically designated. For example, the connector assembly A on circuit board 114 has 32 terminal positions in its two sixteen position socket rows 108a and 108b. Socket row 108b is not shown. Package B has twelve terminals in each row. Both of the interconnect packages C and D have sixteen terminal positions in each row. On the other hand, the active device upper package E has only fourteen positions in each row. The letters A, B, C, D and E in the table designate the connector assembly A and the packages B, C, D and E. The table shows a solid circle to indicate where a designated package lead is in low electrical resistance contact with another lead. A horizontal line indicates a connection between packages or to the connector assembly. A vertical line indicates an internal connection in a package. Accordingly, and by way of example, the vertical lines 126 and 128 under column C in FIG. 9 represent the internal shunts 126' and 128' in FIG. 8. The vertical lines 130 and 132 in column D of FIG. 9 represent the internal current shunts 130' and 132' in FIG. 7.

The nested packages readily formed into a unitary assembly by soldering or the like. Soldering can be conveniently effected by applying a solder paste to the respective electrode terminals before assembly and then heating the terminal leads to reflow the solder. In the alternative the package can be placed on its side and the terminals exposed to a wave soldering operation.

It should also be recognized that some integrated circuit packages have inactive leads. In such event, the corresponding leads in the adjacent interconnection package are free to be used for rerouting of leads. We would ordinarily prefer to cut such leads short on the integrated circuit package but this is not necesaarily required.

The embodiments of the invention in which an exclusive property or provilege is claimed are defined as follows:

1. At least two integrated circuit packages of similar type, which type has at least one row of terminal leads, assembled to permit the terminal lead row of each package to share contacts in a row of terminal lead contacts even though similar electrical functions are associated with differently located terminal leads in the package rows, the assembly comprising the aforementioned integrated circuit packages, two interconnecting packages of similar type nested together with and between the integrated circuit packages so as to form middle packages in a nest of such packages, the middle two packages each having at least one more terminal lead in their rows than the integrated circuit packages, all active terminal leads of one integrated circuit package contacting a terminal lead on its adjacent middle package, less than all leads on the latter package contacting selected leads on its adjacent middle package, less than all the leads on the last-mentioned package contacting all active leads on the other integrated circuit package, means in each middle package providing an electrical shunt between one of its lead contacting a lead on an integrated circuit package and another of its leads contacting a lead on the other middle package, whereby terminal lead location on the one integrated circuit package is rerouted to a different location on the other integrated circuit package, and electrical connection to the other integrated circuit package, leads also appropriately electrically connects the differently located leads on the one integrated circuit package.

2. A compact vertical integration assembly of two different dual-in-line integrated circuit packages without electrically paralleling all package terminal leads comprising a nested stack of at least four dual-in-line type packages, the top and bottom packages of the four containing a monolithic integrated circuit chip and spaced apart by upper and lower middle packages, the middle packages both containing low resistance means for internally interconnecting selected terminal leads and having equal length terminal lead rows on corresponding sides, with the row on each side being longer than the row on the corresponding side of either of top and bottom packages, some of said selected leads being end leads in their rows, said leads aligned for mutual interconnection, each active terminal lead on the top package overlapping and soldered to a terminal lead on the upper middle package, selected leads of the latter package overlapping and soldered to selected leads on the lower middle package, all active bottom package leads overlapped by and soldered to a lower middle package lead, at least one of said end leads on the lower middle package being elongated so as to provide an additional termination in the bottom package terminal lead row, effective to form a dual-in-line unit assembly having at least one composite terminal lead row in which the top package not only shares differently located but functionally similar terminal connections with the bottom package but also has its own separate terminal connections.

3. A compact vertical integration assembly of at least two integrated circuit packages having different locations of functionally similar terminal leads comprising a stack of packages each having at least one row of outwardly extending terminal leads, two noncontiguous packages in the stack each containing an integrated circuit, two contiguous middle packages in the stack disposed between said integrated circuit packages and each having at least one more terminal lead than said integrated circuit packages, active terminal leads of the top integrated circuit package contacting a terminal lead on its underlying upper middle package, less than all leads on the latter package contacting selected leads on its contiguous lower middle package, less than all the leads on the last-mentioned package contacting all active leads on the bottom integrated circuit package, means within each middle package providing an electrical shunt between one of its leads contacting a lead on a package above it and another of its leads contacting a lead on a package below it, whereby terminal connection to the bottom row of package leads also appropriately connects all integrated circuit package leads.

4. A compact vertical integration assembly of at least two discrete integrated circuit packages having locationally and functionally similar and dissimilar terminal leads comprising a first integrated circuit package having at least two parallel rows of regularly spaced terminal leads, a first interconnection package on the first integrated circuit package and having corresponding similar terminal lead rows, a second interconnection package on the first interconnection package and having similar terminal lead rows, a second integrated circuit package on the second interconnection package and having similar terminal lead rows, both rows of leads on the interconnection packages containing at least two additional leads than the rows of either integrated circuit package, selected leads on the interconnection packages being shorter than others to prevent contact with a terminal lead on an underlying package, means on said packages for aligning corresponding leads in said rows, less than all leads on the interconnection packages contacting one another, all active leads on each integrated circuit package containing corresponding leads on its contiguous interconnection package, two leads on one interconnection package contacting two corresponding leads on the other interconnection package and not contacting integrated circuit package leads, one of these two interconnection package leads also contacting a lead on one of the integrated circuit packages, the other of these two leads forming an additional member in a row of leads on one of the integrated circuit packages, said interconnection packages each having an electrical shunt between one of said two terminals and one of said selected terminals for rerouting an electrical signal to a different terminal lead location, and all contacting terminals soldered together to form a unitary package assembly in which connection to one integrated circuit package terminal lead row also appropriately connects the locationally and functionally different terminal leads on the other integrated circuit package.

* * * * *